(12) United States Patent
Mebarki et al.

(10) Patent No.: US 8,084,310 B2
(45) Date of Patent: Dec. 27, 2011

(54) SELF-ALIGNED MULTI-PATTERNING FOR ADVANCED CRITICAL DIMENSION CONTACTS

(75) Inventors: Bencherki Mebarki, Santa Clara, CA (US); Li Yan Miao, San Francisco, CA (US); Christopher Dennis Bencher, San Jose, CA (US); Jen Shu, Saratoga, CA (US)

(73) Assignee: Applied Materials, Inc., Santa Clara, CA (US)

( * ) Notice: Subject to any disclaimer, the term of this patent is extended or adjusted under 35 U.S.C. 154(b) by 44 days.

(21) Appl. No.: 12/603,371

(22) Filed: Oct. 21, 2009

(65) Prior Publication Data

US 2010/0136792 A1    Jun. 3, 2010

Related U.S. Application Data

(60) Provisional application No. 61/107,986, filed on Oct. 23, 2008.

(51) Int. Cl.
*H01L 21/00* (2006.01)

(52) U.S. Cl. ........ 438/164; 438/128; 438/412; 438/703; 257/E21.214; 257/E21.532; 257/E21.536

(58) Field of Classification Search ............ 438/44, 438/412, 599; 257/E21.532, E21.533, E21.534, 257/E21.536
See application file for complete search history.

(56) References Cited

U.S. PATENT DOCUMENTS

2008/0315746 A1* 12/2008 Gosain et al. ............. 313/357

* cited by examiner

*Primary Examiner* — Cheung Lee
(74) *Attorney, Agent, or Firm* — Kilpatrick Townsend & Stockton LLP (57) ABSTRACT

Embodiments of the present invention pertain to methods of forming patterned features on a substrate having a reduced pitch in two dimensions as compared to what is possible using standard photolithography processing techniques using a single high-resolution photomask. A spacer layer is formed over a two-dimensional square grid of cores with a thickness chosen to leave a dimple at the center of four cores on the corners of a square. The spacer layer is etched back to reveal the substrate at the centers of the square. Removing the core material results in double the pattern density of the lithographically defined grid of cores. The regions of exposed substrate may be filled again with core material and the process repeated to quadruple the pattern density.

16 Claims, 8 Drawing Sheets

SELF-ALIGNED MULTI-PATTERNING FOR ADVANCED CRITICAL DIMENSION CONTACTS

CROSS-REFERENCE TO RELATED APPLICATION

This nonprovisional patent application claims priority to U.S. provisional patent application No. 61/107,986, filed Oct. 23, 2008, which is incorporated herein by reference in its entirety for all purposes.

BACKGROUND OF THE INVENTION

The application relates generally to substrate processing methods and particularly to process sequences which increase the density of features on the substrate.

Shrinking integrated circuits (ICs) may result in improved performance, increased capacity and/or reduced cost. Each device shrink requires more sophisticated techniques to form the features. Photolithography is commonly used to pattern features on a substrate. An exemplary feature is a line of a material which may be a metal, semiconductor or insulator. The linewidth is the width of the line and the spacing is the distance between adjacent lines. Pitch is defined as the distance between a same point on two neighboring lines. The pitch is equal to the sum of the linewidth and the spacing. Due to various factors including the radiation wavelength, photolithography techniques have a minimum pitch below which a particular photolithographic technique may not reliably form features. Clearly, the minimum pitch of any given photolithographic technique can limit feature size reduction.

Figure 1A:
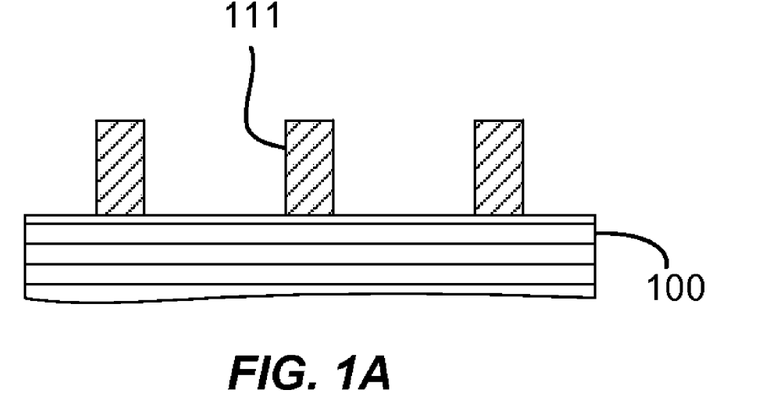
- FIGS. 1A-1G illustrate cross-sectional views representing a conventional self-aligned double patterning (SADP) process in accordance with the prior art.
Figure 1B:
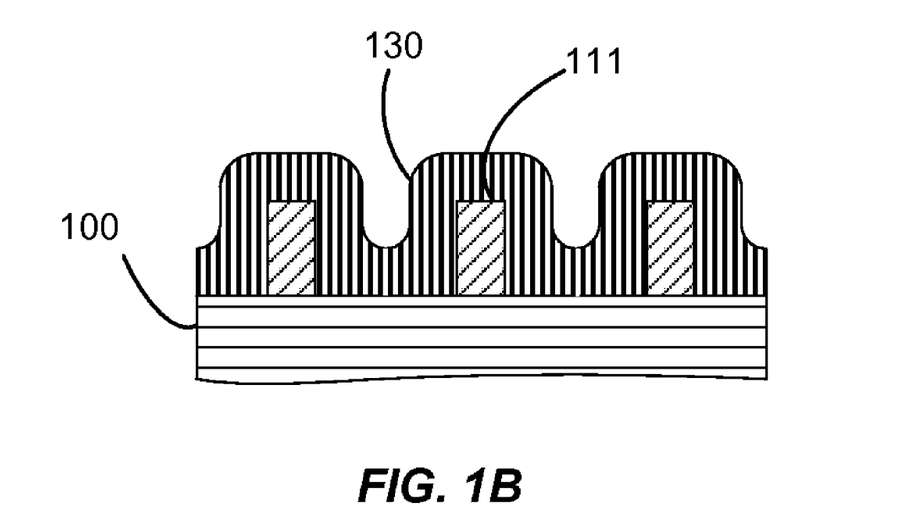
Figure 1C:
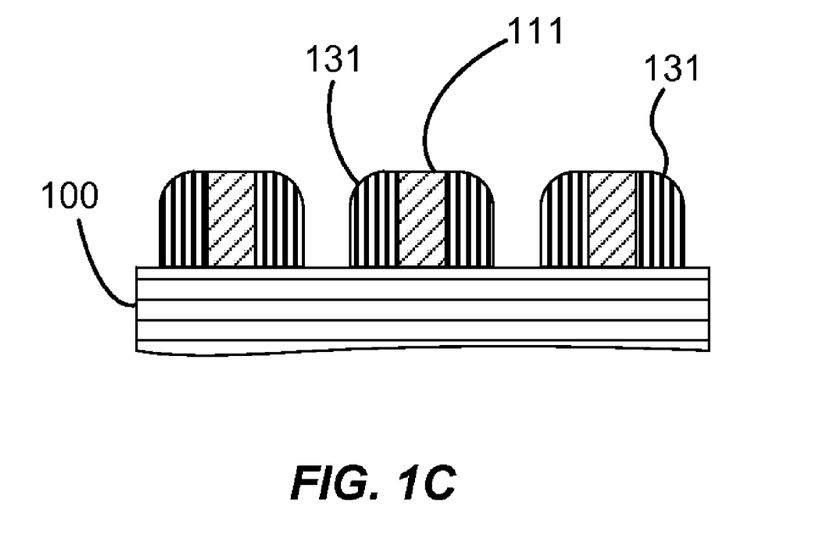
Figure 1D:
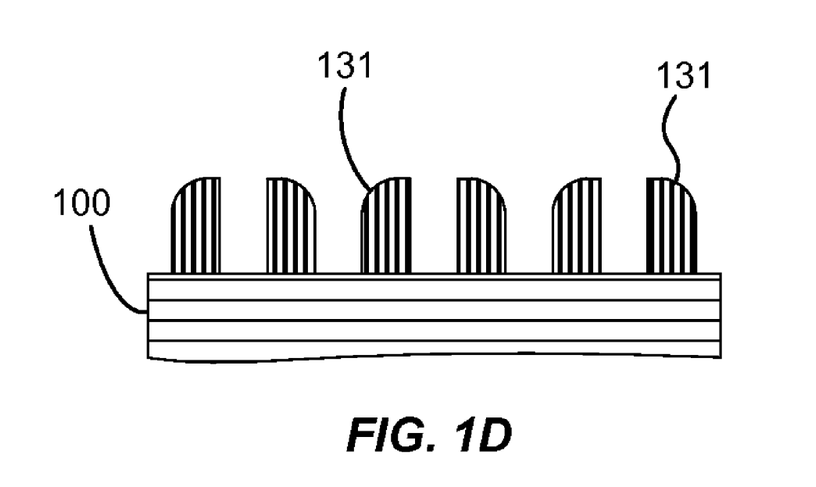
Figure 1E:
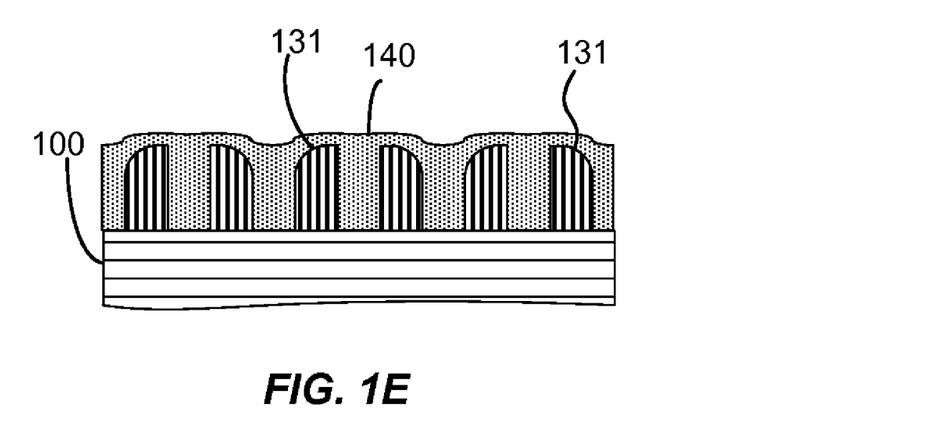
Figure 1F:
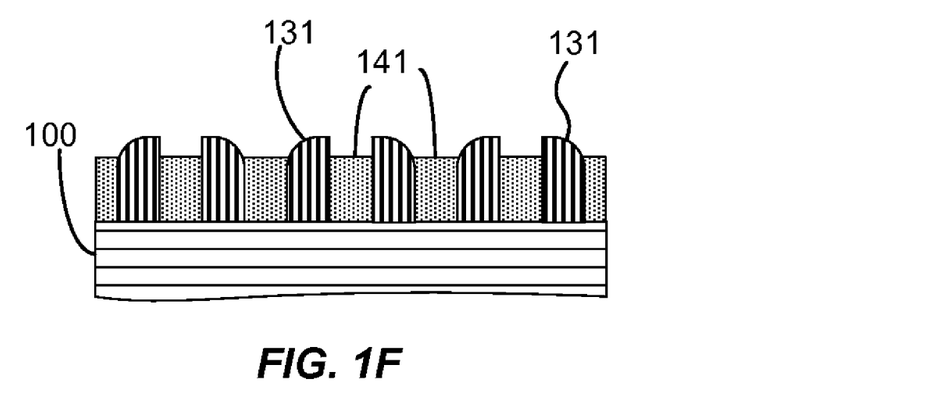
Figure 1G:
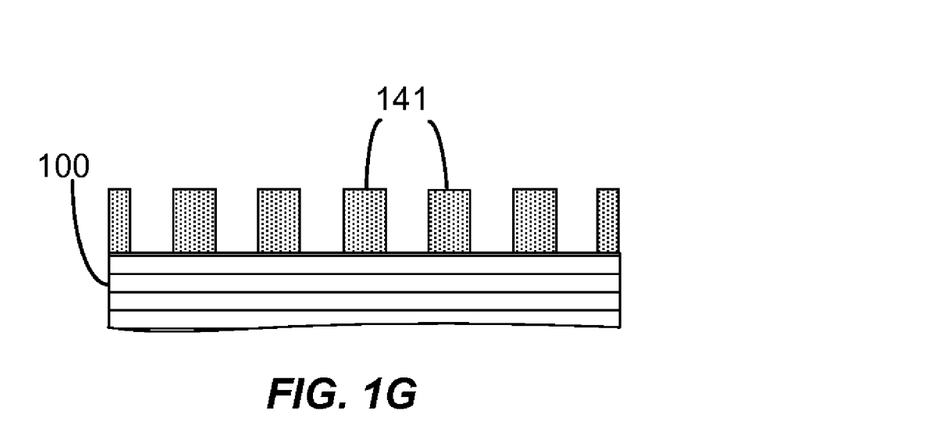

Self-aligned double patterning (SADP) is one method for extending the capabilities of photolithographic techniques beyond their supposed minimum pitch. Such a method is illustrated in FIGS. 1A-G. With reference to FIG. 1A, patterned features 111 are formed from sacrificial structural material above a substrate 100 using standard photo-lithography and etching techniques. The patterned features 111 are referred to as placeholders, mandrels or cores and have linewidths and/or spacings near the optical resolution of a photolithography system using a high-resolution photomask. As shown in FIG. 1B, a conformal layer 130 of hard mask material is subsequently deposited over cores 111. Hard mask spacers or ribs 131 are then formed on the sides of cores 111 by preferentially etching the hard mask material from the horizontal surfaces with an anisotropic spacer etch. The resulting structure is shown in FIG. 1C. Cores 111 may then be removed, leaving behind hard mask spacers 131 (FIG. 1D). At this point hard mask spacers 131 may be used as an etch mask for patterning the substrate and subsequently removed in a positive tone process flow. Alternatively, in a negative tone process, regions between the spacers are filled with material (140 in FIG. 1E), the filler material is etched back (141 in FIG. 1F) and used as a mask after spacers 131 are removed (FIG. 1G). With either positive or negative tone process flows, the density of features is twice that of the photo-lithographically patterned features. In the figures, the pitch of hard mask spacers or ribs 131 is half the pitch of patterned features 111. The process flows outlined above decrease the pitch along one dimension.

BRIEF SUMMARY OF THE INVENTION

Embodiments of the present invention pertain to methods of forming patterned features on a substrate having a reduced pitch in two dimensions as compared to what is possible using standard photolithography processing techniques using a single high-resolution photomask. A spacer layer is formed over a two-dimensional square grid of cores with a thickness chosen to leave a dimple at the center of four cores on the corners of a square. The spacer layer is etched back to reveal the substrate at the centers of the square. Removing the core material results in double the pattern density of the lithographically defined grid of cores. The regions of exposed substrate may be filled again with core material and the process repeated to quadruple the pattern density.

Embodiments of the invention include methods of forming patterned features on a substrate. The methods may include forming a first sacrificial structural layer of core material on the substrate, patterning the first sacrificial structural layer to form a core at each corner of a square with a side equal to a first pitch. The method further includes forming a conformal layer of spacer material over the cores and exposed substrate leaving a dimple at the center of the square, anisotropically etching the conformal layer to expose the cores and a region of the substrate at the center of the square and removing the cores.

Embodiments of the invention may further include methods of patterning a substrate having a first sacrificial structural layer of core material using a single high-resolution photomask. The methods may include depositing a layer of photoresist over the first sacrificial structural layer, patterning the layer of photoresist by exposing the layer of photoresist to radiation through the single high-resolution photomask and developing the layer of photoresist to form a first pattern of photoresist features. The first pattern includes a two-dimensional array which repeats in each dimension with a first pitch. The methods further include transferring the first pattern into the first sacrificial structural layer to form a first two-dimensional array of cores including four cores at the corners of a first square with side length about equal to the first pitch. The methods further include forming a first conformal layer of spacer material over the four cores and exposed substrate leaving a first dimple at the center of the first square and anisotropically etching the first conformal layer to expose the four cores and a region of the substrate at the center of the first square. The methods further include removing the first two-dimensional array of cores, depositing a second sacrificial structural layer, partially etching the second sacrificial structural layer to reveal spacer material, and etching the spacer material leaving a second two-dimensional array of cores having twice the density of the first two-dimensional array of cores. The second two-dimensional array of cores includes four cores at the corners of a second square with a second side length about equal to the first pitch divided by the square root of two. The methods further include forming a second conformal layer of spacer material over the second two-dimensional array of cores and exposed substrate leaving a second dimple at the center of the second square, anisotropically etching the second conformal layer to expose the four cores and a region of the substrate at the center of the second square, and removing the second two-dimensional array of cores.

Further areas of applicability of the present disclosure will become apparent from the detailed description provided hereinafter. It should be understood that the detailed description and specific examples, while indicating various embodiments, are intended for purposes of illustration only and are not intended to necessarily limit the scope of the disclosure.

BRIEF DESCRIPTION OF THE DRAWINGS

A further understanding of the nature and advantages of the invention may be realized by reference to the remaining por

In the appended figures, similar components and/or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION OF THE INVENTION

Embodiments of the present invention pertain to methods of forming patterned features on a substrate having a reduced pitch in two dimensions as compared to what is possible using standard photolithography processing techniques using a single high-resolution photomask. A spacer layer is formed over a two-dimensional square grid of cores with a thickness chosen to leave a dimple at the center of four cores on the corners of a square. The spacer layer is etched back to reveal the substrate at the centers of the square. Removing the core material results in double the pattern density of the lithographically defined grid of cores. The regions of exposed substrate may be filled again with core material and the process repeated to quadruple the pattern density.

One of the most common uses of a self-aligned double patterning (SADP) process is to form high density arrays of parallel lines. SADP processes (such as the process of FIG. 1) are used to create parallel lines of material. While this lends itself to forming long features (bit lines, power lines, etc.) which repeat along a direction perpendicular to the length of the feature, there is also a need to create small aspect ratio features that repeat in two directions to form an two dimensional array of features. Metal vias which connect metal lines located on different levels may benefit from replication afforded by embodiments of the invention.

Figure 2:
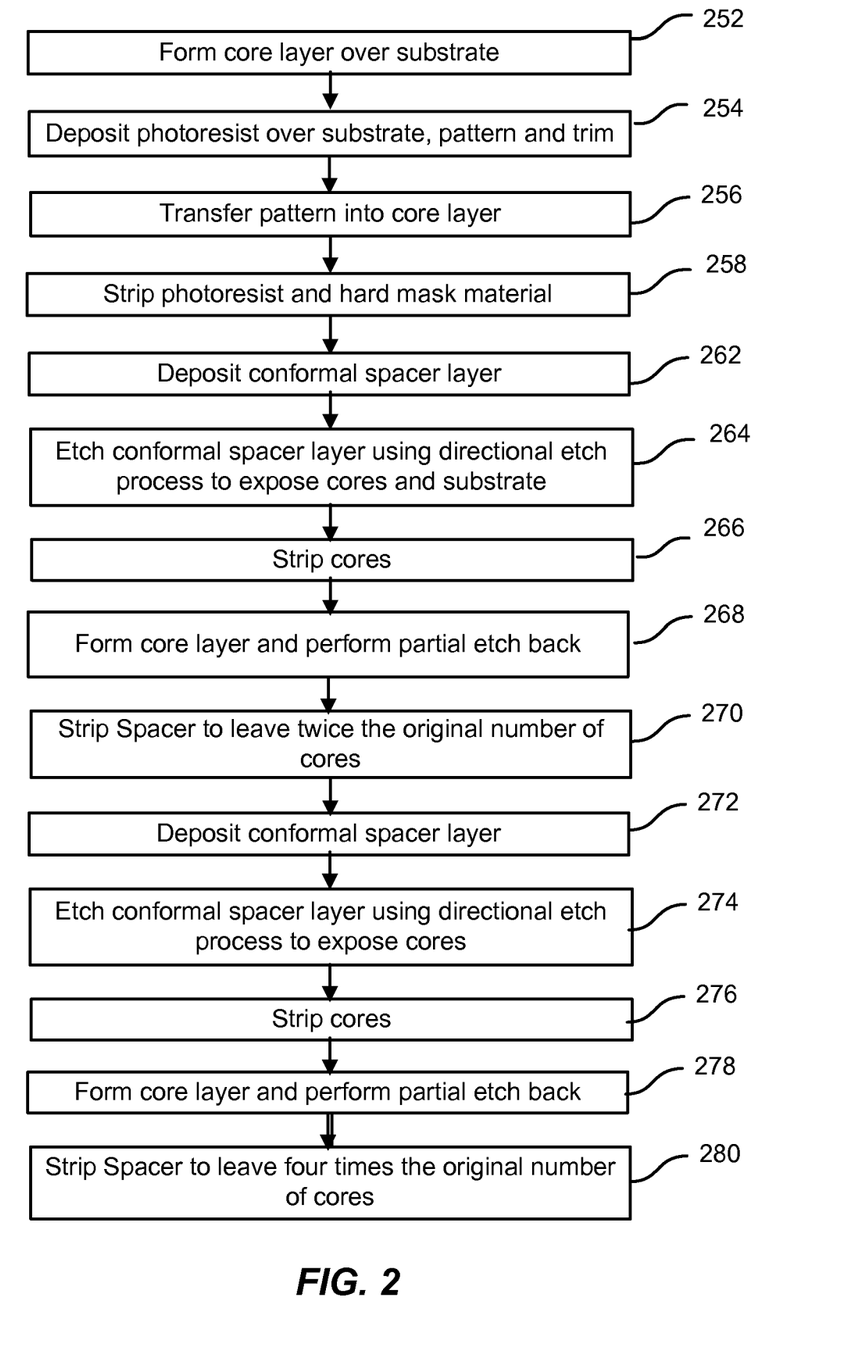
FIG. 2 is a flowchart depicting steps associated with a self-aligned double patterning process according to one embodiment of the invention.

In order to better understand and appreciate the invention, reference is made to FIG. 2, which is a flowchart depicting steps associated with a two-dimensional self-aligned double patterning process according to one embodiment of the invention, and FIGS. 3A-F, which illustrate perspective views of a structure as it is formed by the steps set forth in FIG. 2. The method starts by forming a sacrificial structural layer (interchangeably referred to as a core layer) on a substrate (step 252). The core layer is followed by a layer of photoresist, but a hard mask layer may be formed between those two layers, in embodiments, especially when core layer material and photoresist are etched by similar mechanisms.

The photoresist is patterned then trimmed in Step 254 to form a repetitive pattern of pillars (not shown in the Figures) with the same pitch in orthogonal directions at or near the resolution limit of a photolithography process. In the embodiment shown in FIGS. 2-3, the pitches in the two orthogonal directions match. Small differences between the two orthogonal pitches of up to about 10-20% may be tolerated while still allowing the following patterning techniques to successfully reduce the pitch according to disclosed embodiments.

In the process flow outlined in FIGS. 2-3, the photoresist pillars may have a diameter of about one quarter of the pitch 305 in the 2-iteration embodiment depicted. Other diameters are possible especially when the number of iterations deviates from the embodiment according to FIGS. 2-3. The pattern may be transferred into the hard mask layer (if used) and the patterned hard mask may then be used to pattern the core layer to form a plurality of cores 311-1 (step 256). Each core 311-1 corresponds to one of the pillars formed in the photoresist layer and the cores inherit their pitch 305 from the array of photoresist pillars. Following the removal of any remaining photoresist and hard mask material (step 258), a substrate 300 supports pillars of cores 311-1 as shown in FIG. 3A.

Figure 3A:
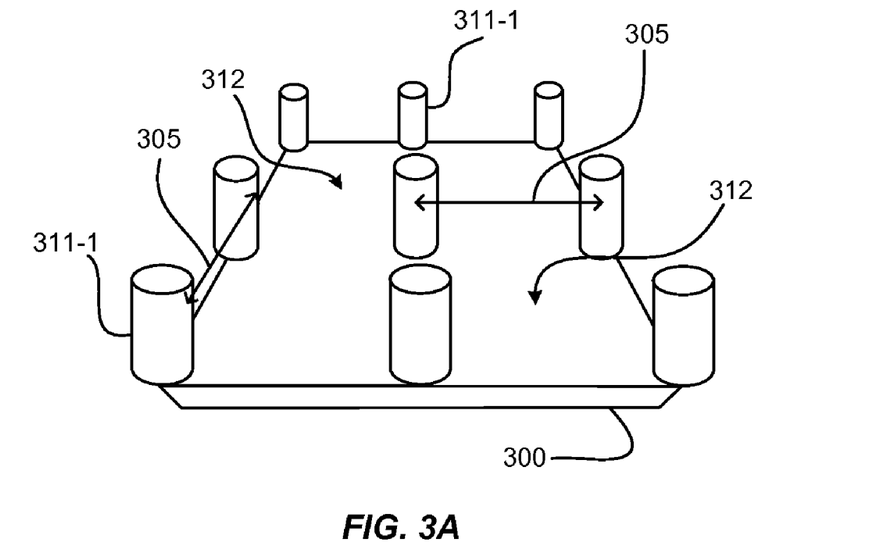
FIGS. 3A-3F are perspective views representing a self-aligned double patterning (SADP) process according to an embodiment of the invention.

A conformal layer of spacer material is then deposited on the cores (step 262) and the exposed substrate. Mounds of spacer material accumulate above each core 311-1 while dimples in the spacer material are created at the center 312 between four adjacent cores. Four adjacent cores form a square with a side equal to the pitch 305 of the core spacing. The width of the dimples is reduced as the spacer material grows away from each adjacent core. The thickness of the conformal layer is chosen such that the width of the dimples matches the width of the cores. The dimples reflect the rough dimensions of the vias or cores which will be added. In embodiments of the invention, the conformal layer is a dielectric layer such as a SACVD silicon oxide or silicon nitride layer and is preferably deposited to a thickness such that the diameter of the dimples is near the diameter of the cores 311-1. The conformal layer of spacer material may have a sidewall thickness between about 40% and about 52% or between about 43% and about 49% of the pitch.

As used herein, a conformal layer refers to a generally uniform layer of material on a surface in the same shape as the surface, i.e., the surface of the layer and the surface being covered are generally parallel. A person having ordinary skill in the art will recognize that the deposited material likely cannot be 100% conformal and thus the term "generally" allows for acceptable tolerances.

The conformal layer is then anisotropically etched (a vertical etch) to expose substrate 300 in the center of each square forming cavities 335-2 and expose an upper surface of narrow cores 311-1 (step 264). Next, the exposed core material is removed (step 266) in an etch step leaving a spacer layer 331, shown in FIG. 3B, with cavities 335-1 where the cores were removed and additional cavities 335-2 near the center of the squares. The etch step used to remove the core material may exhibit a selectivity toward etching the core material relative to the conformal material of the spacers (the spacer material). The two dimensional density of the cavities (335-1, 335-2) is twice the density of the cores 311-1 of FIG. 3A.

At this point, the process sequence of FIGS. 2-3 may be stopped and the spacer layer 331 can be used as a hard mask to etch the double density pattern into the underlying substrate. Alternatively, the cavities may be filled with material such as a metal (e.g. tungsten) to form vias. These options may be pursued after any number of repetitions of this density doubling process.

The process may be continued as shown in FIGS. 2-3 to further increase the density of the pattern. Continuing with Step 268, the cavities are filled with core material by depositing a layer of core material and performing a partial etch back. FIG. 3C shows cores (311-1, 311-2) in the cavities of the spacer layer 331. The spacer material may be stripped (step 270), leaving cores (311-1, 311-2) on the substrate 300 as depicted in FIG. 3D. The cores may be used as a mask to pattern the substrate which provides twice the density of the original pattern of cores 311-1 in FIG. 3A. The pattern of cores (311-1, 311-2) forms smaller squares which are oriented forty five degrees from the original pattern of cores 311-1. The sides of these new squares are equal to the original pitch 305 divided by the square root of two.

The presence of squares in the double-density distribution of cores (311-1, 311-2) allows the process of Steps 262-270 to be repeated (steps 272-280) once again to form four times the original core density. A second conformal layer of spacer material, when deposited on the cores (311-1, 311-2) in Step 272, forms mounds of spacer material above the cores and dimples in the spacer material near the center of the smaller squares. The second conformal layer of spacer material may have a sidewall thickness 319 between about 20% and about 30% or between about 22% and about 28% of the original pitch 305. Upon anisotropically etching the second conformal layer of spacer material in Step 274, regions of substrate 335-3 near the center of each square are exposed as are the cores (311-1, 311-2). FIG. 3E shows the conformal layer after the cores (311-1, 311-2) are removed in the core etch step of Step 276, creating vacancies (335-1, 335-2). The density of all vacancies (335-1, 335-2 and 335-3) is four times the original density of cores 311-1. The vacancies (335-1, 335-2 and 335-3) form squares with sides half the size of the original pitch 305 in FIG. 3A. As before, the patterned conformal layer 331 in FIG. 3E may be used as a mask, filled with metal or filled with core material. When filled with core material and partially etched back (step 278), cores 311-3 are formed and shown in FIG. 3F following a spacer strip (step 280). At this point, the cores can be used as an etch mask to pattern the substrate at four times the density of the original core pattern 311-1 of FIG. 3A.

The process can even be repeated, in some embodiments, to further increase the density of cores. Repeating the process steps 262-280 again would increase the density of cores by a factor of sixteen. The sizes of the cores may need to be adjusted depending on final density of the process. For a sixteen fold increase in density, the cores may be made about half the diameter in the example described in FIG. 2-3, or about one eighth the original pitch 305. In order to achieve this, the thicknesses of each of the four conformal layers should be calculated based on the desired diameter of the vias or cores created in the last step.

Generally speaking, the diameter of cores or vias in the last step will be equal to their spacing. With this design criterion, the thicknesses of the conformal layers can be calculated for 1-4 repetitions of the density doubling process described herein. The appropriate thicknesses are shown in Table 1.

TABLE 1

Thickness of conformal layer as a % of lithography pitch

| | Number of Iterations of Density Doubling | | | |
|---|---|---|---|---|
| | 1[1] | 2 | 3[1] | 4 |
| 1st iteration | 35.4% | 45.7% | 53.0% | 58.2% |
| 2nd iteration | | 25.0% | 32.3% | 37.5% |
| 3rd iteration | | | 17.7% | 22.9% |
| 4th iteration | | | | 12.5% |

[1]Orientation of pattern will be rotated 45° from lithographically defined array.

The percentages in Table 1 are calculated based on simple geometric considerations. The diameter of the core is determined based on the final pitch. The final pitch is 70.7%, 50.0%, 35.4% and 25.0% of the initial pitch for iterations 1-4, respectively. The diameter of the vias or cores will be half the final pitch for the design criterion outlined previously, or 35.4%, 25.0%, 17.7% and 12.5% of the initial pitch for iterations 1-4, respectively. The thicknesses of the conformal layer at a given step is simply the pitch at that step minus the diameter of the vias or cores for the process.

The thickness of the conformal layer during the first iteration may be between about 30% and about 40% of the initial pitch, between about 40% and about 50% of the initial pitch, between about 50% and about 56% of the initial pitch or between about 56% and about 60% of the initial pitch in different embodiments. The thickness of the conformal layer during the second iteration may be between about 20% and about 30% of the initial pitch, between about 28% and about 36% of the initial pitch or between about 35% and about 40% of the initial pitch in different embodiments. The thickness of the conformal layer during the third iteration may be between about 15% and about 21% of the initial pitch or between about 20% and about 26% of the initial pitch in different embodiments. Finally, the thickness of the conformal layer during the fourth iteration may be between about 10% and about 15% of the initial pitch in an embodiment. Larger numbers of iterations may be employed and the target percentage as well as ranges can be determined with the same methods used herein.

As indicated previously, the density doubling process described herein will tolerate small differences between the two orthogonal pitches. The squares described with reference to FIGS. 2-3 become slightly rectangular in some embodiments. A rectangle with up to about a 20% difference between its length and width may be tolerated. Greater differences result in significant deformation of the smaller pitch features introduced at the center of each rectangle according to disclosed methods.

As used herein "substrate" may be a support substrate with or without layers formed thereon. The support substrate may be an insulator or a semiconductor of a variety of doping concentrations and profiles and may, for example, be a semiconductor substrate of the type used in the manufacture of integrated circuits. There is also considerable flexibility in the choice of materials used for the cores and the spacer layer. Exemplary material systems may be helpful in explaining additional details of two-dimensional self-aligned double patterning processes according to disclosed embodiments. In embodiments, the core layers and conformal layers are made of hydrogenated amorphous carbon and silicon nitride, respectively. The amorphous carbon film may be Advanced Patterning Film™ (APF) made by Applied Materials of Santa Clara, Calif. APF is described in U.S. Pat. No. 6,573,030, which issued on Jun. 3, 2003, and which is herein incorporated by reference in its entirety for all purposes. Hydrogenated amorphous carbon may have an atomic composition of between about 10 percent hydrogen to about 60 percent hydrogen.

Figure 3B:
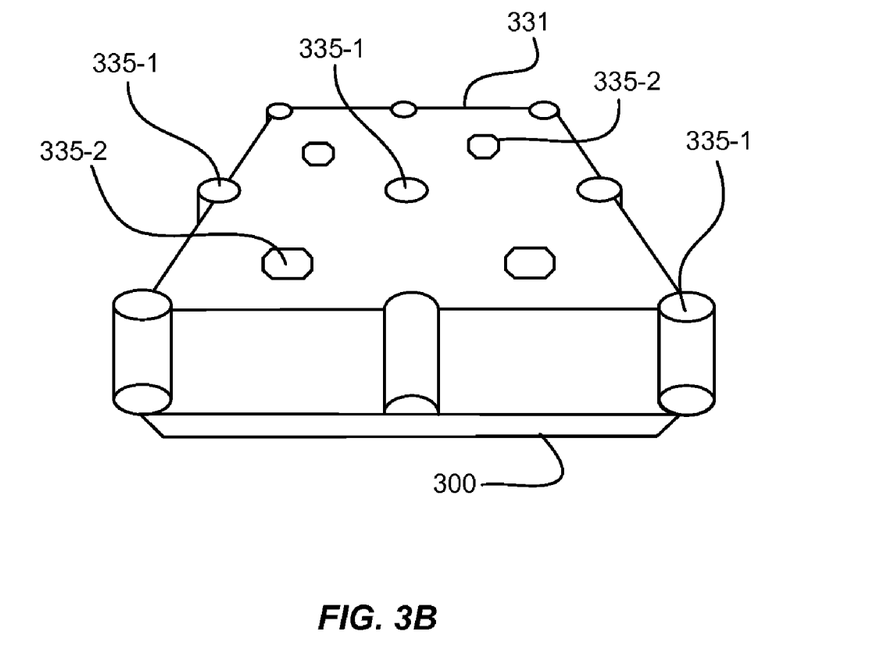
Figure 3C:
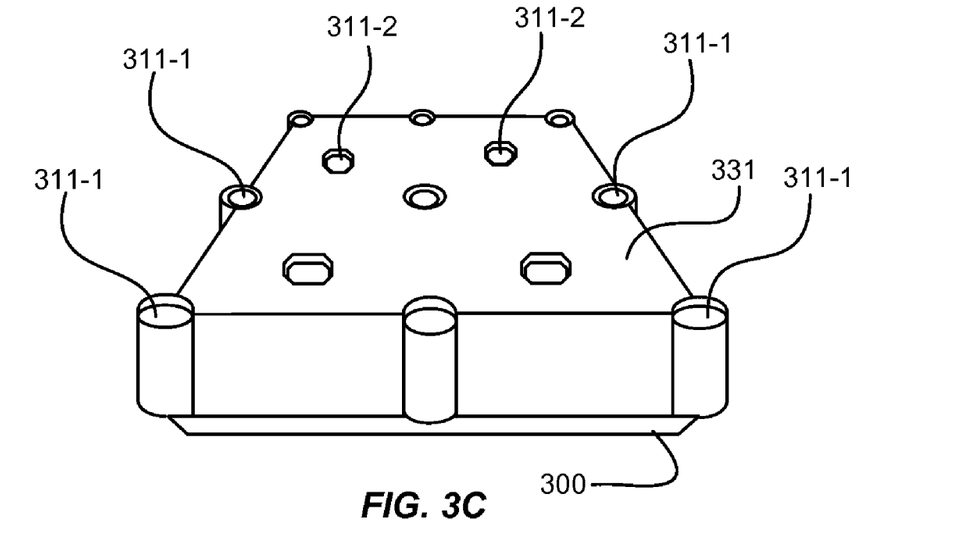
Figure 3D:
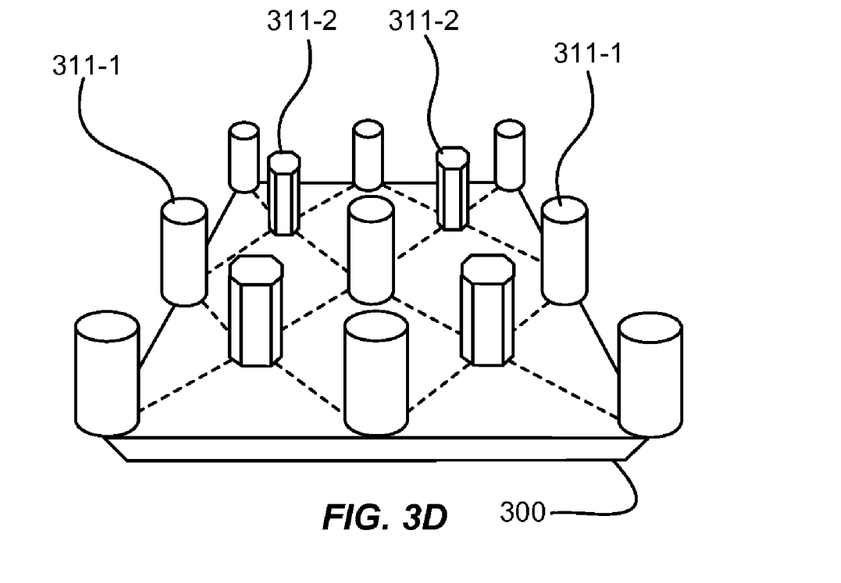
Figure 3E:
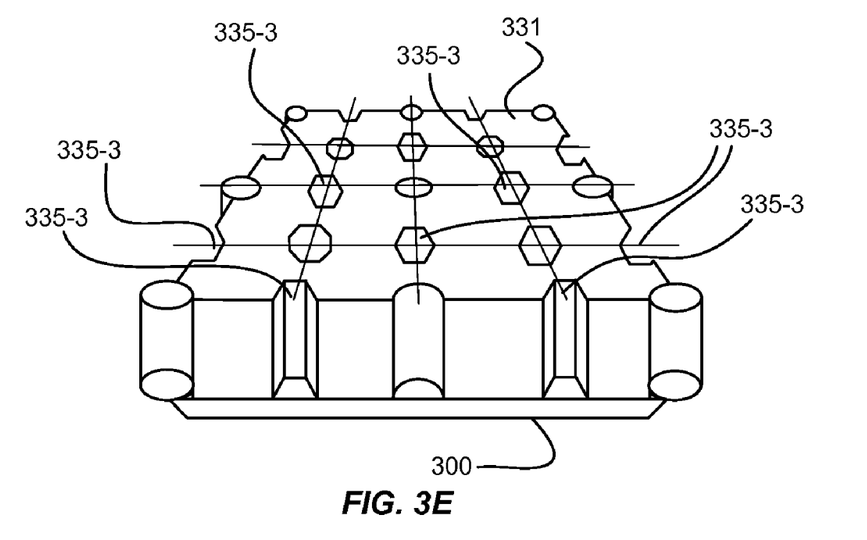
Figure 3F:
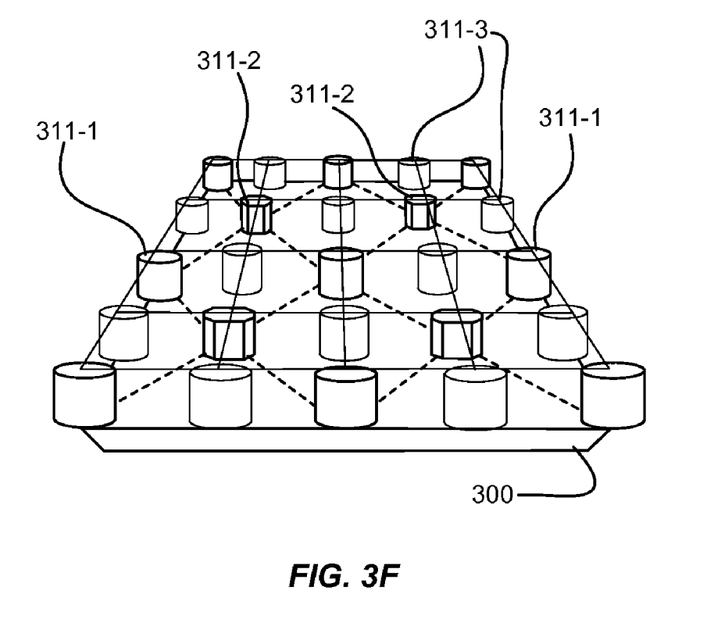

The core-etch may involve ashing the amorphous carbon cores to attain the configurations of FIG. 3B and FIG. 3E. Ashing is often done by introducing $O_2$ or $O_3$ into a plasma above the substrate to oxidize the hydrogenated amorphous carbon and pumping the by-products away. The ashing process can also involve halogen-containing gases. During ashing hydrogenated amorphous carbon to form the initial pattern of FIG. 3A, it may be desirable to have a hard mask layer between photoresist and the hydrogenated amorphous carbon since they may have similar ashing rates. Core layers made from another material may not require the hard mask layer.

The spacer material is selected, in part, so it will withstand the ashing process better than the hydrogenated amorphous carbon in order to retain the patterned spacer layer. The spacer layer may be made of silicon nitride in embodiments. Alternatively, the spacer layer may be made of silicon oxide, however, the oxygen content in the spacer layer near the interface with the core material can cause ashing. Ashing may compromise the integrity of cores and their ability to support subsequent spacer depositions or withstand an etch step. In order to avoid ashing, the deposition of a silicon oxide spacer layer may be modified. Silicon oxide deposition may begin with a silicon-rich interface and transition to the normal stoichiometry of silicon oxide thereafter. The silicon rich interface has less oxygen content and suppresses ashing of the cores. Representative deposition methods for forming silicon oxide include SACVD and PECVD and often involve ozone or oxygen-containing plasma effluents created by exciting an oxygen-containing gas in a plasma. Reducing the concentration of ozone or oxygen-containing plasma effluents relative to the silicon-containing concentration creates a silicon-rich silicon oxide which helps reduce damage to amorphous carbon when formed near or at the interface between the two materials.

Figure 4:
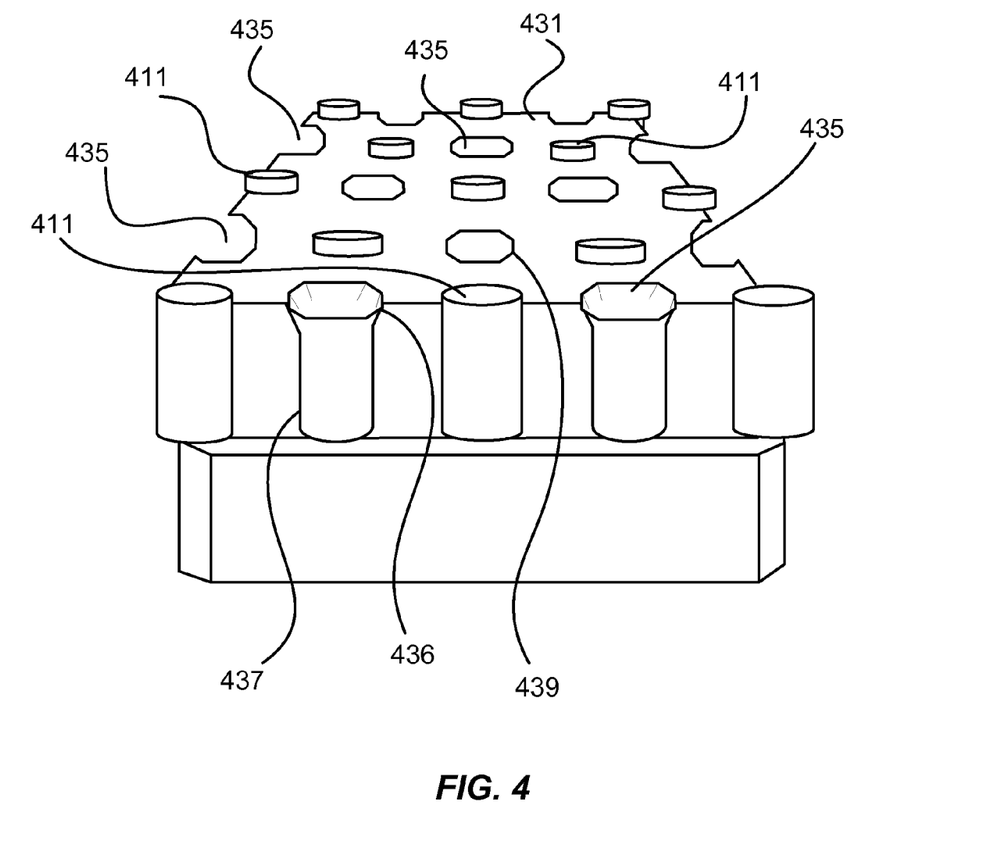
FIG. 4 is a perspective view at an intermediate step of a self-aligned double patterning (SADP) process according to an embodiment of the invention.

The process of forming cavities within the conformal layer of spacer material does not necessarily result in a simple cylindrical shape. FIG. 4 is a perspective view at an intermediate step of the self-aligned double patterning (SADP) process represented in FIGS. 2-3. The intermediate configuration of the process is shown prior to the removal of cores in Step 276. In this view the cavities 435 are shown to vary from a cylindrical outline. Near the top 436 of each cavity, the diameter may be larger than at the bottom 437 due to the conformal growth pattern of the layer of spacer material 431 and possibly the etch process which creates the cavities 435. The shape of the opening 439 near the top of the cavities 435 may not be a circle. It is shown here as a polygon which may result from the interrupted progression of the spacer material as it grows out from the neighboring cores 411. The shape of the opening 439 is likely to be complex, but may be four-sided or eight-sided in different embodiments. These cavities may become more cylindrical during processing steps involving, for example, increased substrate temperature or etching. Reference may be made herein to the diameter of dimples and cavities even when they are irregularly shaped. Such a reference simply means the diameter of a cylindrical approximation to the irregularly shape in a region close to the substrate where the flaring associated with the conformal growth of the spacer layer has less influence.

The description above has been given to help illustrate the principles of the present invention. It is not intended to limit the scope of the invention in any way. A large variety of variants are apparent, which are encompassed within the scope of this invention. Also, while the invention has been described in detail and with reference to specific examples thereof, it will be apparent to one skilled in the art that various changes and modifications can be made therein without departing from the spirit and scope thereof. These equivalents and alternatives are intended to be included within the scope of the present invention.

What is claimed is:

1. A method of forming patterned features on a substrate, the method comprising:
    forming a first sacrificial structural layer of core material on the substrate;
    patterning the first sacrificial structural layer to form a plurality of evenly spaced cores from the first sacrificial layer such that the plurality of cores are arranged in a pattern comprising a plurality of squares with each square in the plurality of squares being defined by four adjacent cores, wherein a side of each square in the pattern has a length equal to a first pitch;
    forming a conformal layer of spacer material over the cores and exposed substrate leaving a dimple at a center of each square in the pattern;
    anisotropically etching the conformal layer to expose the cores and a region of the substrate at the center of each square in the pattern; and
    removing the cores.

2. The method of claim 1 further comprising the steps of:
    depositing a second sacrificial structural layer;
    partially etching the second sacrificial structural layer; and
    etching the spacer material leaving a plurality of cores, comprising a core at each corner of the square and a core at a center of the square.

3. The method of claim 1 wherein a diameter of one of the cores at the corner of the square is about one quarter of the first pitch.

4. The method of claim 1 wherein a thickness of the conformal layer is between about 40% and about 52% of the first pitch.

5. The method of claim 1 wherein a thickness of the conformal layer is between about 43% and about 49% of the first pitch.

6. The method of claim 1 wherein the core material comprises hydrogenated amorphous carbon having an atomic composition of between about 10 percent hydrogen to about 60 percent hydrogen.

7. The method of claim 1 wherein the spacer material comprises silicon nitride.

8. A method of patterning a substrate having a first sacrificial structural layer of core material using a single high-resolution photomask, the method comprising:
    depositing a layer of photoresist over the first sacrificial structural layer;
    patterning the layer of photoresist by exposing the layer of photoresist to radiation through the single high-resolution photomask and developing the layer of photoresist to form a first pattern of photoresist features, wherein the first pattern comprises a two-dimensional array which repeats in each dimension with a first pitch;
    transferring the first pattern into the first sacrificial structural layer to form a first two-dimensional array of cores from the first sacrificial structural layer comprising a first plurality of cores arranged in a first square pattern including a first plurality of squares where each square in the first plurality of squares is defined by four adjacent cores and has a side length of about the first pitch;
    forming a first conformal layer of spacer material over the first plurality of cores and exposed substrate leaving a first dimple at a center of each square in the first square pattern;
    anisotropically etching the first conformal layer to expose the first plurality of cores and a region of the substrate at the center of each square in the first square pattern;
    removing the first two-dimensional array of cores;
    depositing a second sacrificial structural layer;
    partially etching the second sacrificial structural layer to reveal spacer material;
    etching the spacer material leaving a second two-dimensional array of cores formed from the spacer material comprising a second plurality of cores arranged in a second square pattern having twice the density of the first square pattern and including a second plurality of squares where each square in the second plurality of squares is defined by four adjacent cores and, has a side length of about the first pitch divided by the square root of two;

forming a second conformal layer of spacer material over the second plurality of cores and exposed substrate leaving a second dimple at a center of each square in the second square pattern;

anisotropically etching the second conformal layer to expose the second plurality of cores and a region of the substrate at the center of square in the second square pattern; and removing the second two-dimensional array of cores.

9. The method of claim 8 further comprising:

depositing a metal layer; and partially removing the metal layer to form a two-dimensional array of vias having four times the density of the first two-dimensional array of cores.

10. The method of claim 8 wherein a diameter of one of the cores in the first two-dimensional array of cores is about one quarter of the first pitch.

11. The method of claim 8 wherein a thickness of the first conformal layer is between about 40% and about 52% of the first pitch.

12. The method of claim 8 wherein a thickness of the first conformal layer is between about 43% and about 49% of the first pitch.

13. The method of claim 8 wherein a thickness of the second conformal layer is between about 20% and about 30% of the first pitch.

14. The method of claim 8 wherein a thickness of the second conformal layer is between about 22% and about 28% of the first pitch.

15. The method of claim 8 wherein the core material comprises hydrogenated amorphous carbon having an atomic composition of between about 10 percent hydrogen to about 60 percent hydrogen.

16. The method of claim 8 wherein the spacer material comprises silicon and at least one of oxygen and nitrogen.

* * * * *